(12) United States Patent
Chen

(10) Patent No.: US 6,882,011 B1
(45) Date of Patent: Apr. 19, 2005

(54) ESD PROTECTION DEVICE HAVING REDUCED TRIGGER VOLTAGE

(75) Inventor: Shiao-Shien Chen, Hsin-Chu (CN)

(73) Assignee: United Microelectronics Corp., Hsin-Chu (TW)

(*) Notice: Subject to any disclaimer, the term of this patent is extended or adjusted under 35 U.S.C. 154(b) by 0 days.

(21) Appl. No.: 10/708,504

(22) Filed: Mar. 8, 2004

(51) Int. Cl.[7] .............................................. H01L 23/62
(52) U.S. Cl. ....................... 257/355; 257/316; 257/314; 257/317; 257/363; 257/360; 257/532; 257/368; 257/315; 257/522
(58) Field of Search ................................. 257/355, 314, 257/316, 317, 367, 360, 532, 368, 315, 522

(56) References Cited

U.S. PATENT DOCUMENTS 5,844,300 A * 12/1998 Alavi et al. ................. 257/532
6,809,386 B1 * 10/2004 Chaine et al. ............... 257/368
2002/0195648 A1 * 12/2002 Hirata ......................... 257/315

* cited by examiner

Primary Examiner—Nathan J. Flynn
Assistant Examiner—Fazli Erdem
(74) Attorney, Agent, or Firm—Winston Hsu

(57) ABSTRACT

An ESD protection device having reduced trigger voltage is disclosed. A first MOS transistor includes a first gate, a first heavily doped region at one side of the first gate, and a second heavily doped region at the other side of the first gate. A second MOS transistor is laterally disposed in proximity to the first MOS transistor. The second MOS transistor includes a second gate, a third heavily doped region at one side of the second gate, and a fourth heavily doped region at the other side of the second gate. The floating gate MOS transistor is located between the first and second MOS transistors. A floating gate MOS transistor is serially connected to the first MOS transistor via the second heavily doped region and is serially connected to the second MOS transistor via the third heavily doped region.

15 Claims, 7 Drawing Sheets

ESD PROTECTION DEVICE HAVING REDUCED TRIGGER VOLTAGE

BACKGROUND OF INVENTION

1. Field of the Invention

The present invention relates to an electrostatic discharge (ESD) protection device, and more particularly to an ESD protection device having reduced trigger voltage and improved second breakdown current characteristic.

2. Description of the Prior Art

Electrostatic discharge (ESD) in semiconductor integrated circuits (IC"s) is a well-known problem. The inadvertent presence of a sudden voltage spike in an integrated circuit can cause physical destruction of circuit features. For example, ESD-induced spikes can rupture the thin gate oxide of a field effect transistor (FET), or simply degrade the p-n junction of a semiconductor device, effectively destroying proper IC operation. A typical "gate oxide" in a MOS transistor will rupture when its dielectric strength is more than approximately $10^7$ V/cm.

Please refer to FIG. 1 and FIG. 2. FIG. 1 is a partial plan view showing a prior art ESD device 10. FIG. 2 is a cross-sectional view of the prior art ESD device 10 taken along section A—A of FIG. 1. As shown in FIG. 1 and FIG. 2, the prior art ESD device 10 comprises fingers including two NMOS transistors 11 and 12 formed on a P type semiconductor substrate 20. The NMOS transistor 11 comprises an $N^+$ doped region 132, an N-type lightly-doped drain (hereinafter referred to as "NLDD") region 141 extended from the $N^+$ doped region 132 to the polysilicon gate 112, an $N^+$ doped region 134, an NLDD region 142 extended from the $N^+$ doped region 134 to the polysilicon gate 112, a P channel 151 defined between the NLDD regions 141 and 142, a gate dielectric layer 111 formed between the substrate 20 and the gate 112, and spacers 113 on sidewalls of the gate 112. NMOS transistor 12 comprises the $N^+$ doped region 134, an NLDD region 143 extended from the $N^+$ doped region 134 to the polysilicon gate 122, an $N^+$ doped region 136, an NLDD region 144 extended from the $N^+$ doped region 136 to the polysilicon gate 122, a P channel 152 defined between the NLDD regions 143 and 144, a gate dielectric layer 121 formed between the substrate 20 and the gate 122, and spacers 123 on sidewalls of the gate 122.

As seen in FIG. 1, a plurality of metal contacts 162, 164, and 166 are distributed on the $N^+$ doped regions 132, 134, and 136, respectively, for connecting signals. When operating the above-described NMOS based ESD device, by way of example, the metal contacts 162 and 166 are connected to ground or Vss, the metal contacts 164 are connected to the input/output (I/O) terminal, the semiconductor substrate 20 is grounded.

However, the operation performance of the above-described ESD device 10 is not satisfactory, for example, overhigh trigger voltage and inferior second breakdown current characteristic. It is desired to reduce the trigger voltage of the ESD device for well protection of integrated circuit. One approach to reduce the above-described NMOS based ESD device is applying so-called "Zener implant". As shown in FIG. 3, P type dopants are implanted deep into the substrate 20 to form a Zener implant region underneath the $N^+$ doped region 134. However, this approach is not effective in PMOS based ESD device. Furthermore, the prior art Zener implant method needs an additional photo mask, thus not cost-effective.

SUMMARY OF INVENTION

Accordingly, it is the primary objective of the present invention to provide an improved ESD device having reduced trigger voltage and performance without needing an additional photo mask for Zener implant.

An electrostatic discharge (ESD) protection device having reduced trigger voltage is disclosed. A substrate of first conductivity type is provided. A first MOS transistor of second conductivity type is disposed on the substrate. The first MOS transistor comprises a first gate, a first gate dielectric disposed under the first gate, a first heavily doped region of the second conductivity type implanted into the substrate at one side of the first gate, and a second heavily doped region of the second conductivity type implanted into the substrate at the other side of the first gate. A second MOS transistor of the second conductivity type is laterally disposed on the substrate in proximity to the first MOS transistor. The second MOS transistor comprises a second gate, a second gate dielectric disposed under the second gate, a third heavily doped region of the second conductivity type implanted into the substrate at one side of the second gate, and a fourth heavily doped region of the second conductivity type implanted into the substrate at the other side of the second gate. At least one floating gate MOS transistor comprising a floating gate dielectric is formed on the substrate. A floating gate overlies the floating gate dielectric. The floating gate MOS transistor is located between the first MOS transistor and the second MOS transistor. The floating gate MOS transistor is connected to the first MOS transistor via the second heavily doped region and is connected to the second MOS transistor via the third heavily doped region.

Other objects, advantages and novel features of the invention will become more clearly and readily apparent from the following detailed description when taken in conjunction with the accompanying drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
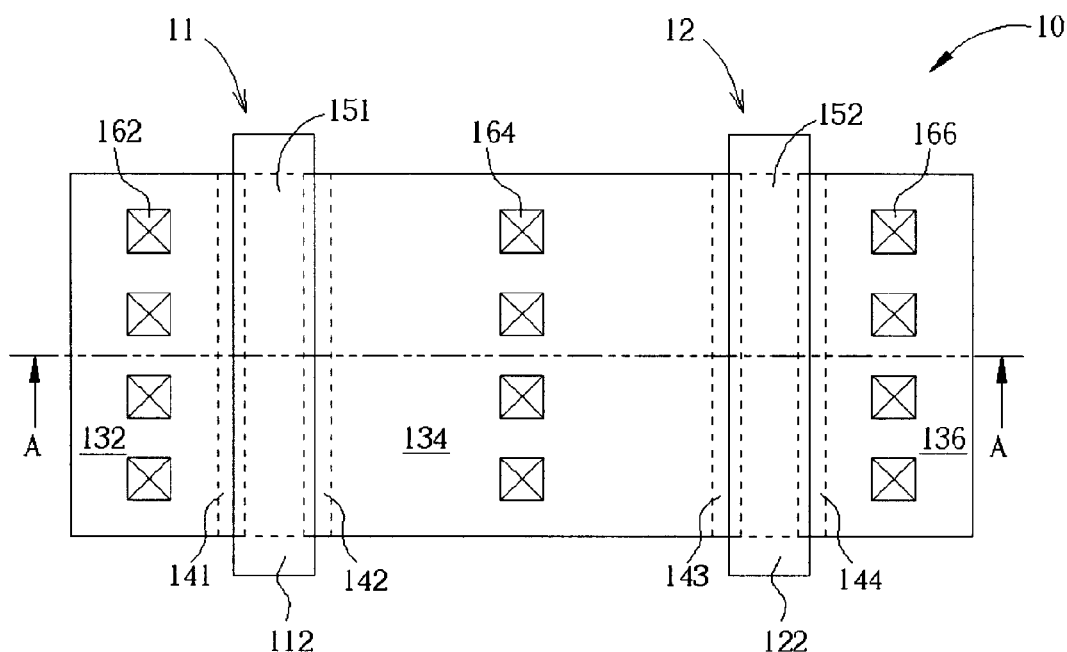
FIG. 1 is a partial plan view showing a prior art ESD device.
Figure 2:
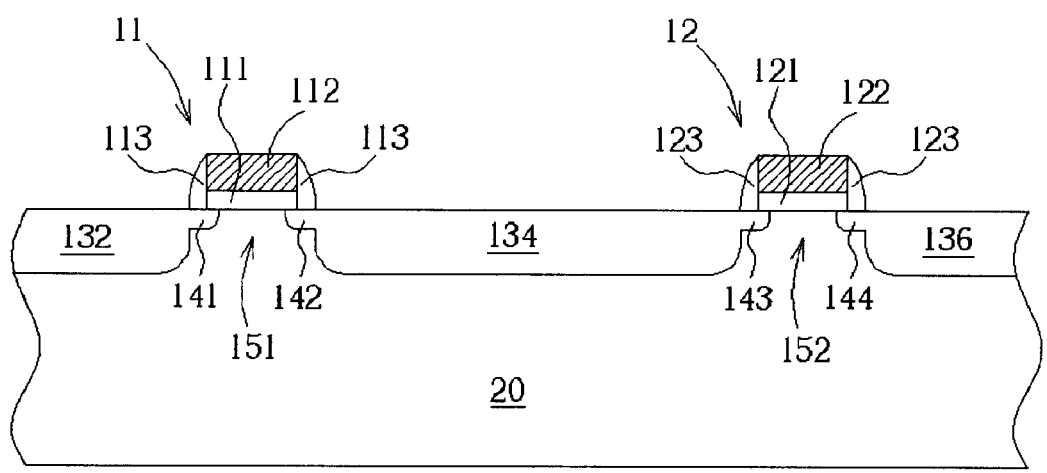
FIG. 2 is a cross-sectional view of the prior art ESD device taken along section A—A of FIG. 1.
Figure 3:
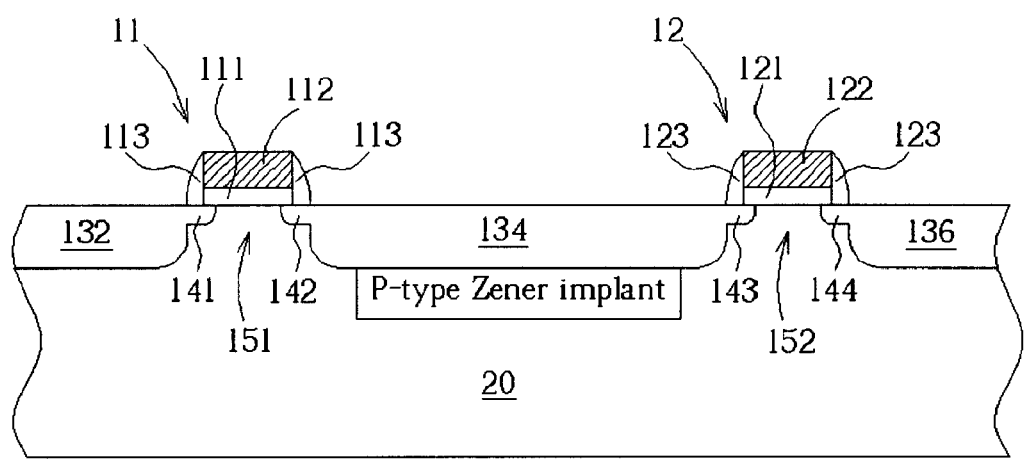
FIG. 3 is a schematic cross-sectional diagram illustrating a prior art ESD device having a Zener implant region therein for reducing trigger voltage of the ESD device.
Figure 4:
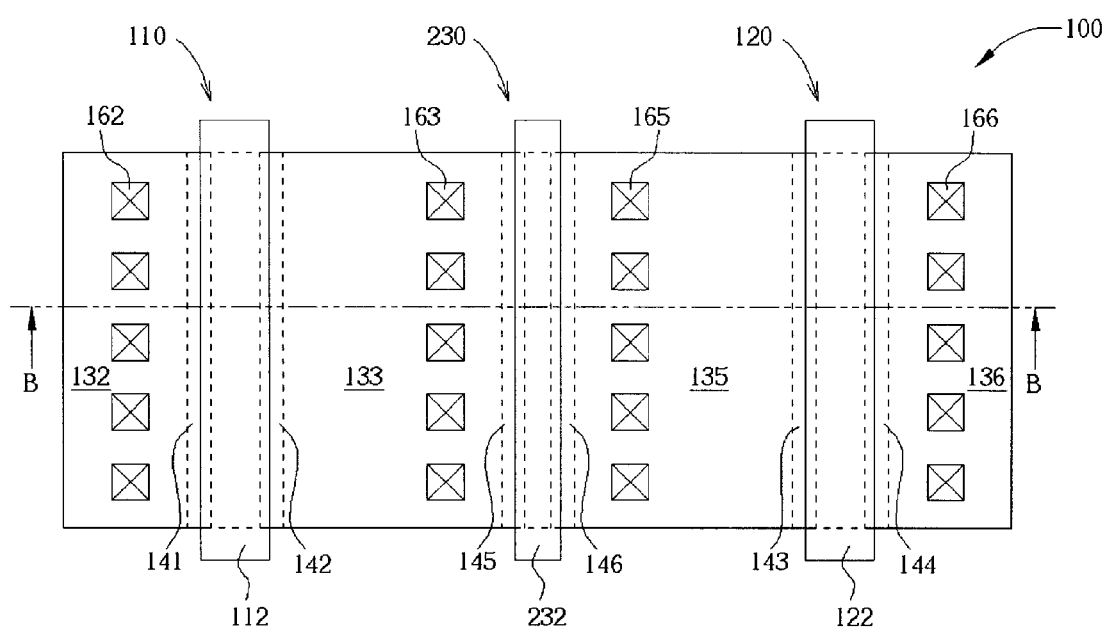
FIG. 4 is a plan view showing a portion of an ESD protection device according to one preferred embodiment of the present invention.
Figure 5:
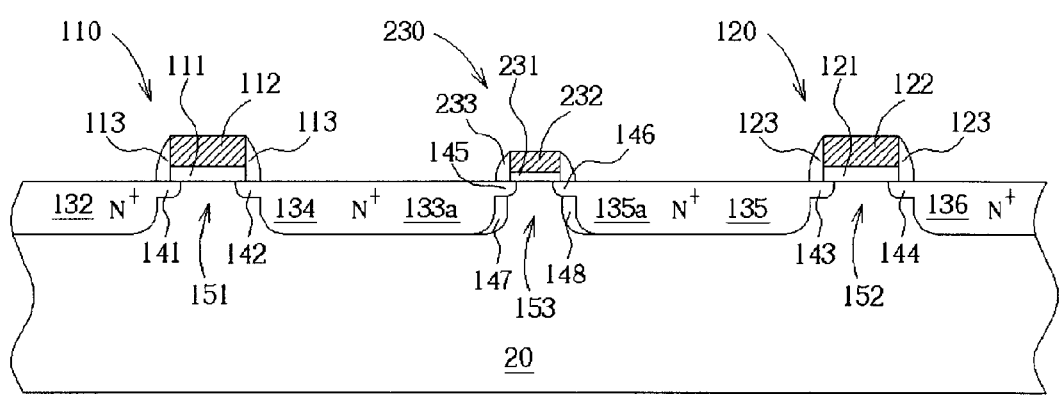
FIG. 5 is a cross-sectional view of ESD protection device taken along section B—B of FIG. 4.

Please refer to FIG. 4 and FIG. 5, wherein like numerals designate similar elements or regions. FIG. 4 is a plan view showing a portion of an ESD protection device 100 according to one preferred embodiment of the present invention. FIG. 5 is a cross-sectional view of ESD protection device 100 taken along section B—B of FIG. 4. As shown in FIG. 4 and FIG. 5, in accordance with the first preferred embodiment of this invention, the ESD protection device 100 comprises plural finger portions including two NMOS transistors 110 and 120 formed on a P type semiconductor substrate 20. The NMOS transistor 110 comprises an N+ doped region 132, an NLDD region 141 extended from the N+ doped region 132 to the polysilicon gate 112, an N+ doped region 133, an NLDD region 142 extended from the N+ doped region 133 to the polysilicon gate 112, a P channel 151 defined between the NLDD regions 141 and 142, a gate dielectric layer 111 formed between the substrate 20 and the gate 112, and spacers 113 on sidewalls of the gate 112. The NMOS transistor 120 comprises an N+ doped region 135 that is spaced-apart from the N+ doped region 133, an NLDD region 143 extended from the N+ doped region 135 to the polysilicon gate 122, an N+ doped region 136, an NLDD region 144 extended from N+ doped region 136 to the polysilicon gate 122, a P channel 152 defined between the NLDD regions 143 and 144, a gate dielectric layer 121 formed between the substrate 20 and the gate 122, and spacers 123 on sidewalls of the gate 122. According to the preferred embodiment, the thickness of the gate dielectric layer 111 and the thickness of the gate dielectric layer 121 are substantially the same.

The present invention features that the ESD protection device 100 further comprises a floating gate transistor 230 disposed on the P substrate 20 between the NMOS transistors 110 and 120. Spacers 233 are formed on sidewalls of the floating gate 232 of the floating gate transistor 230. A floating gate dielectric layer 231 is formed between the floating gate 232 and the substrate 20. In operation, the floating gate 232 remains in floating state. As shown in FIG. 4, the floating gate transistor 230 comprises an N+ source 133a and an N+ drain 135a, which are disposed in the P substrate 20 at opposite sides of the floating gate 232. As best seen in FIG. 5, an NLDD region 145 laterally extends from the N+ source 133a to the floating gate 232, and an NLDD region 146 extends from the N+ drain 135a to the floating gate 232. A P channel 153 is defined between the NLDD regions 145 and 146. According to the first preferred embodiment, the N+ source 133a of the floating gate transistor 230 merges with the N+ doped region 133, and the N+ drain 135a merges with the N+ doped region 135. In other words, the NMOS transistor 110 and the floating gate transistor 230 share one N+ doped region, and the NMOS transistor 120 and the floating gate transistor 230 share one N+ doped region. According to the first preferred embodiment, the thickness of the floating gate dielectric layer 231 is smaller than the thickness of the gate dielectric layers 111 and 121. Likewise, a plurality of metal contacts 162, 163, 165, and 166 are distributed on the N+ doped regions 132, 133, 135, and 136, respectively, for connecting signals. In operation, the metal contacts 162 and 166 are connected to ground or Vss. The metal contacts 163 and 165 are connected to the I/O terminal. The P substrate 20, the gates 112 and 122 are connected to ground.

As best seen in FIG. 4, the ESD protection device 100 comprises an NMOS transistor 110 that is serially connected to the floating gate transistor 230 via the merged N+ doped region 133 and N+ source 133a, and an NMOS transistor 120 that is serially connected to the floating gate transistor 230 via the merged N+ doped region 135 and N+ source 135a.

As best seen in FIG. 5, it is another feature of the present invention that the ESD protection device 100 further comprises P+ halo implant regions 147 and 148 that are respectively implanted into the P substrate 20 under the NLDD regions 145 and 146 of the floating gate transistor 230. It is advantageous that the P+ halo implant regions 147 and 148 help to reduce parasitic bipolar breakdown voltage of the ESD protection device 100, thereby obtaining a lower trigger voltage.

Figure 6:
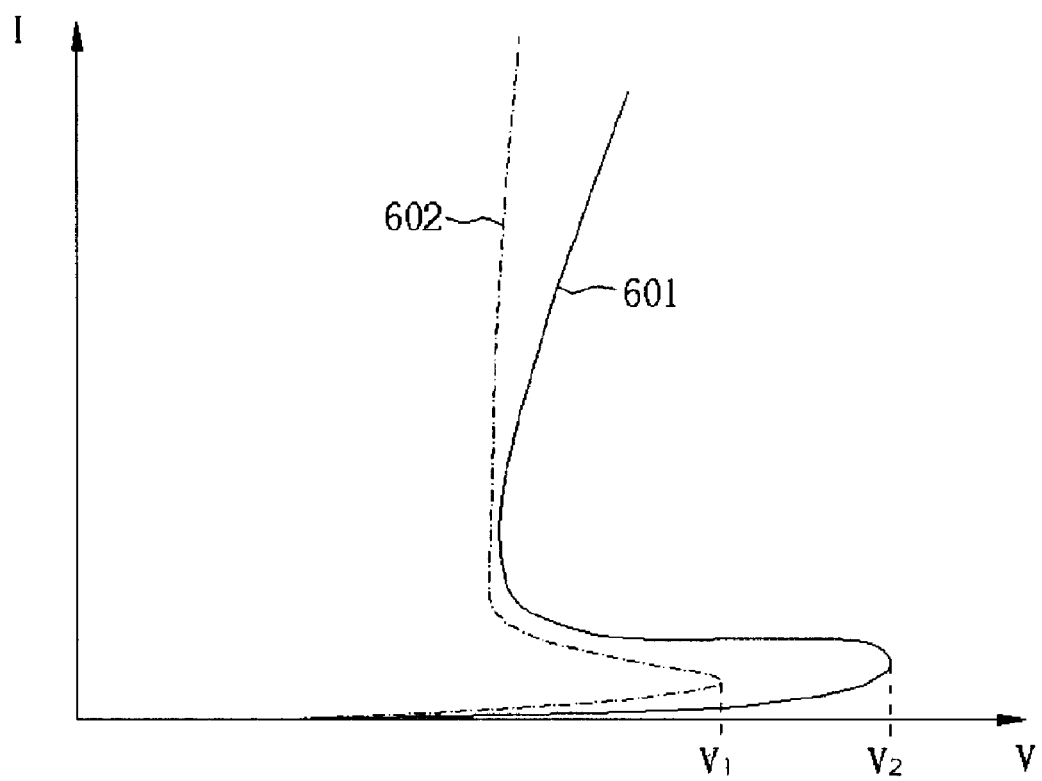
FIG. 6 is a comparison plot illustrating the I-V performance curves of the prior art ESD device and the present invention ESD device.

Please refer to FIG. 6. FIG. 6 is a comparison plot illustrating the I-V performance curves of the prior art ESD device 10 and the present invention ESD device 100, wherein Curve 601 represents the I-V curve of the prior art ESD device 10, and Curve 602 represent s the I-V curve of the present invention ESD device 100. The trigger voltage of the prior art ESD device 10 is designated as $V_2$. It is shown that the present invention ESD device 100 has a lower trigger voltage $V_1$ and better second breakdown current characteristic after snapback occurs.

Figure 7:
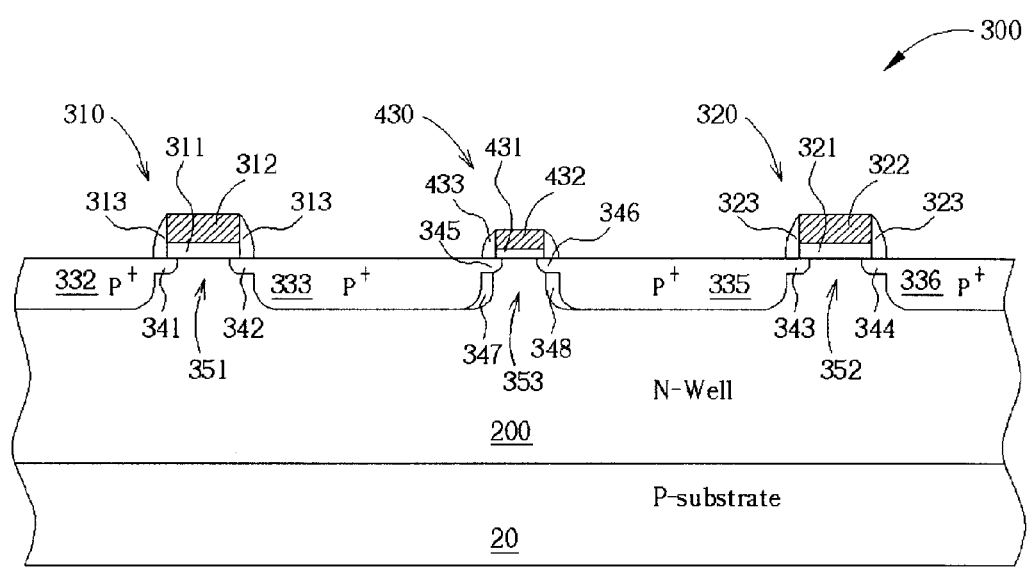
FIG. 7 is a schematic cross-sectional diagram showing an ESD protection device according to a second preferred embodiment of the present invention.

Please refer to FIG. 7. FIG. 7 is a schematic cross-sectional diagram showing an ESD protection device 300 according to a second preferred embodiment of the present invention. The present invention may be applied to PMOS based ESD structures for reducing trigger voltage. As shown in FIG. 7, the ESD protection device 300 comprises two PMOS transistors 310 and 320 formed on an N well 200 of the P type semiconductor substrate 20. The PMOS transistor 310 comprises an P+ doped region 332, a PLDD region 341 extended from the P+ doped region 332 to the polysilicon gate 312, an P+ doped region 333, an PLDD region 342 extended from the P+ doped region 333 to the polysilicon gate 312, a N channel 351 defined between the PLDD regions 341 and 342, a gate dielectric layer 311 formed between the N well 200 and the gate 312, and spacers 313 on sidewalls of the gate 312. The PMOS transistor 320 comprises an P+ doped region 335 that is spaced-apart from the P+ doped region 333, an PLDD region 343 extended from the P+ doped region 335 to the polysilicon gate 322, an P+ doped region 336, an PNLDD region 344 extended from P+ doped region 336 to the polysilicon gate 322, a N channel 152 defined between the PLDD regions 343 and 344, a gate dielectric layer 321 formed between the N well 200 and the gate 322, and spacers 323 on sidewalls of the gate 322. According to the preferred embodiment, the thickness of the gate dielectric layer 311 and the thickness of the gate dielectric layer 321 are substantially the same.

A floating gate transistor 430 is disposed between the PMOS transistors 310 and 320. The floating gate transistor 430 comprises a floating gate 432 stacked on a floating gate dielectric layer 431, and spacers 433 formed on sidewalls of the floating gate 432. In operation, the floating gate remains in floating state. The P+ doped regions 333 and 335 are situated at opposite sides of the floating gate 432, wherein the P+ doped region 333 acts as a source of the floating gate transistor 430, and the P+ doped region 335 acts as a drain of the floating gate transistor 430. A PLDD region 345 extends laterally from the P+ doped region 333 to the floating gate 432. A PLDD region 346 extends laterally from the P+ doped region 335 to the floating gate 432. An N channel is defined between the PLDD regions 345 and 346. In accordance with the second preferred embodiment, the thickness of the floating gate dielectric layer 331 of the floating gate transistor 330 is smaller than the thickness of the gate dielectric layers 311 and 321. In operation, the P+ doped regions 332 and 336 are connected to $V_{DD}$. The P+ doped regions 333 and 335, which are electrically connected to each other by interconnection, are connected to the I/O terminal. The N well 200 is connected to $V_{DD}$.

Those skilled in the art will readily observe that numerous modification and alterations of the device may be made while retaining the teachings of the invention. Accordingly, the above disclosure should be construed as limited only by the metes and bounds of the appended claims.

What is claimed is:

1. An electrostatic discharge (ESD) protection device having reduced trigger voltage, comprising:
   a substrate of first conductivity type;
   a first MOS transistor of second conductivity type disposed on said substrate, said first MOS transistor comprising a first gate, a first gate dielectric disposed under said first gate, a first heavily doped region of said second conductivity type implanted into said substrate at one side of said first gate, and a second heavily doped region of said second conductivity type implanted into said substrate at the other side of said first gate;
   a second MOS transistor of said second conductivity type laterally disposed on said substrate in proximity to said first MOS transistor, said second MOS transistor comprising a second gate, a second gate dielectric disposed under said second gate, a third heavily doped region of said second conductivity type implanted into said substrate at one side of said second gate, and a fourth heavily doped region of said second conductivity type implanted into said substrate at the other side of said second gate; and
   at least one floating gate MOS transistor comprising a floating gate dielectric formed on said substrate and a floating gate overlying said floating gate dielectric, said floating gate MOS transistor being located between said first MOS transistor and said second MOS transistor,
   wherein said floating gate MOS transistor is serially connected to said first MOS transistor via said second heavily doped region and is connected to said second MOS transistor via said third heavily doped region.

2. The ESD protection device according to claim 1 wherein said first heavily doped region is contiguous with a first lightly doped drain (LDD) of said second conductivity type that is under said first gate, said second heavily doped region is contiguous with a second LDD of said second conductivity type that is under said first gate, and a first channel of said second conductivity type is defined between said first LDD and said second LDD under said first gate.

3. The ESD protection device according to claim 1 wherein said third heavily doped region is contiguous with a third LDD of said second conductivity type that is under said second gate, said fourth heavily doped region is contiguous with a fourth LDD of said second conductivity type that is under said second gate, and a second channel of said second conductivity type is defined between said third LDD and said fourth LDD under said second gate.

4. The ESD protection device according to claim 1 wherein said second heavily doped region is contiguous with a fifth LDD of said second conductivity type that is under said floating gate, said third heavily doped region is contiguous with a sixth LDD of said second conductivity type that is under said floating gate, and a third channel of said second conductivity type is defined between said fifth LDD and said sixth LDD under said floating gate.

5. The ESD protection device according to claim 1 wherein said first gate dielectric and said second gate dielectric have a first thickness, and said floating gate dielectric has a second thickness, wherein said first thickness is not equal to said second thickness.

6. The ESD protection device according to claim 5 wherein said first thickness is larger than said first thickness.

7. The ESD protection device of claim 4 further comprising halo implant regions.

8. The ESD protection device according to claim 1 wherein said first conductivity type is P type, and said second conductivity type is N type, and wherein, in operation, said substrate, said first gate, said second gate, said first heavily doped region, and said fourth heavily doped region are all grounded, said floating gate remains floating, and said second heavily doped region, which is electrically connected with said third heavily doped region, is connected to input/output power terminal.

9. The ESD protection device according to claim 1 wherein said first conductivity type is N type, and said second conductivity type is P type, and wherein, in operation, said substrate, said first gate, said second gate, said first heavily doped region, and said fourth heavily doped region are connected to $V_{DD}$, said floating gate remains floating, and said second heavily doped region, which is electrically connected with said third heavily doped region, is connected to input/output power terminal.

10. An electrostatic discharge (ESD) protection device having reduced trigger voltage, comprising:
    a P type substrate;
    a first NMOS transistor disposed on said substrate, said first NMOS transistor comprising a first gate, a first gate dielectric disposed under said first gate, a first $N^+$ doped region implanted into said substrate at one side of said first gate, and a second $N^+$ doped region implanted into said substrate at the other side of said first gate;
    a second NMOS transistor laterally disposed on said substrate in proximity to said first NMOS transistor, said second NMOS transistor comprising a second gate, a second gate dielectric disposed under said second gate, a third $N^+$ doped region implanted into said substrate at one side of said second gate, and a fourth $N^+$ doped region implanted into said substrate at the other side of said second gate, wherein said first gate dielectric and said second gate dielectric has substantially the same thickness: first thickness; and
    at least one floating gate MOS transistor comprising a floating gate dielectric formed on said substrate and a floating gate overlying said floating gate dielectric, said floating gate MOS transistor being located between said first NMOS transistor and said second NMOS transistor, wherein said floating gate MOS transistor is serially connected to said first NMOS transistor via said second $N^+$ doped region and is serially connected to said second NMOS transistor via said third $N^+$ doped region, and wherein said floating gate dielectric has a second thickness, and said second thickness is smaller then said first thickness.

11. The ESD protection device according to claim 10 wherein said first $N^+$ doped region is contiguous with a first NLDD that is under said first gate, said second $N^+$ doped region is contiguous with a second NLDD that is under said first gate, and a first N channel is defined between said first NLDD and said second NLDD under said first gate.

12. The ESD protection device according to claim 10 wherein said third $N^+$ doped region is contiguous with a third NLDD that is under said second gate, said fourth $N^+$ doped region is contiguous with a fourth NLDD that is under said second gate, and a second N channel is defined between said third NLDD and said fourth NLDD under said second gate.

13. The ESD protection device according to claim 10 wherein said second $N^+$ doped region is contiguous with a fifth NLDD that is under said floating gate, said third $N^+$ doped region is contiguous with a sixth NLDD that is under said floating gate, and a third N channel is defined between said fifth NLDD and said sixth NLDD under said floating gate.

14. The ESD protection device according to claim 13 further comprising P+ halo implant regions.

15. The ESD protection device according to claim 10 wherein in operation, said substrate, said first gate, said second gate, said first N$^+$ doped region, and said fourth N$^+$ doped region are all grounded, said floating gate red mains floating, and said second N$^+$ doped region, which is electrically connected with said third N$^+$ doped region, is connected to input/output power terminal.

* * * * *